United States Patent [19]
Kazama et al.

[11] Patent Number: 5,734,616
[45] Date of Patent: Mar. 31, 1998

[54] SEMICONDUCTOR MEMORY DEVICE AND SENSE CIRCUIT

[75] Inventors: Hideto Kazama, Ome; Shuichi Miyaoka, Hannou; Akihiko Emori, Hitachi; Kinya Mitsumoto, Tamamura-machi; Tomoyuki Someya; Masahiro Iwamura, both of Hitachi; Noboru Akiyama, Hitachinaka, all of Japan

[73] Assignee: Hitachi, Ltd., Tokyo, Japan

[21] Appl. No.: 694,059

[22] Filed: Aug. 8, 1996

[30] Foreign Application Priority Data

Aug. 8, 1995 [JP] Japan ................................. 7-222697
Aug. 25, 1995 [JP] Japan ................................. 7-217587

[51] Int. Cl.$^6$ ......................................................... G11C 7/00
[52] U.S. Cl. .............................. 365/206; 365/177; 365/207; 365/208
[58] Field of Search ............................... 365/206, 207, 365/208, 177

[56] References Cited

U.S. PATENT DOCUMENTS

| | | | |
|---|---|---|---|
| 4,899,309 | 2/1990 | Kitazawa et al. | 365/206 |
| 5,301,158 | 4/1994 | Yokomizo | 365/206 |
| 5,473,568 | 12/1995 | Okamura | 365/207 |
| 5,577,002 | 11/1996 | Takahashi | 365/207 |

FOREIGN PATENT DOCUMENTS

| | | |
|---|---|---|
| 62-154287 | 7/1987 | Japan . |
| 62-245592 | 10/1987 | Japan . |
| 2-308489 | 12/1990 | Japan . |

*Primary Examiner*—Son T. Dinh
*Attorney, Agent, or Firm*—Antonelli, Terry, Stout, & Kraus, LLP

[57] ABSTRACT

A static RAM includes pre-amplifiers, which are made up solely of emitter-follower transistors having their collectors supplied with the power voltage, in one-to-one correspondence to sub common data line pairs which are connected by column switches to complementary data line pairs of memory arrays. The pre-amplifier is provided with a first switch which turns on during the selected state to connect the sub common data line pair to the bases of the transistors and a second switch which turns on during the unselected state to provide the bases with a certain bias voltage lower than the readout signal voltage on the sub common data line pair. The emitter-follower transistors have their emitters connected commonly to form common emitter lines, which are connected to pairs of input terminals of main amplifiers made up of CMOS transistors.

25 Claims, 8 Drawing Sheets

0

SEMICONDUCTOR MEMORY DEVICE AND SENSE CIRCUIT

BACKGROUND OF THE INVENTION

The present invention relates to a semiconductor memory device including a static random access memory (static RAM), and particularly to the technology for fabricating a high-speed RAM formed of bipolar transistors and a CMOS (complementary MOS) circuit in combination.

The invention also relates to a sense circuit which is useful for reading signals out of memory cells onto bus lines, and particularly to a sense circuit which is formed of current amplifying circuits and a voltage amplifying circuit, capable of transmitting small-amplitude data signals at a high speed and a small power consumption, and suitable for high-density integration.

Among static RAMs of the Bi-CMOS structure formed of bipolar transistors and a CMOS circuit, there is one that uses emitter-follower transistors as pre-amplifiers in order to speed up the data readout from memory cells. There is a static RAM in which a complementary data line pair connected to a memory cell or one of multiple complementary data line pairs selected by a column switch is connected to the bases of emitter-follower transistors, with their emitters being connected commonly to unselected complementary data line pairs or the emitter of emitter-follower transistor on another complementary data line, and unselected transistors have their bases biased by a relatively lower voltage so that the emitter-follower transistors operate in a differential manner, and selected signals are delivered to main amplifiers, as described in Japanese patent Laid-Open No. Sho 62-245592(1987), for example.

A sense amplifier having a pair of bipolar transistors connected to a pair of input terminals is disclosed in Japanese patent Laid-Open No. Sho 62-54287(1987).

A prior art pertaining to a sense circuit for reading out signals from a memory cell array onto bus lines is described in Japanese patent Laid-Open No. Hei 2-308489(1990), for example.

FIG. 11 is a block diagram showing the arrangement of the sense circuit based on these prior arts. In the figure, reference numeral 100 denotes memory cell arrays, 103 denotes bus lines, 601 denotes intermediate amplifiers, and 602 denotes a main amplifier. This sense amplifying circuit includes multiple intermediate amplifiers 601 each provided for one of the multiple memory cell arrays and adapted to implement the voltage amplification for complementary signals from the memory cell array, and a main amplifier 602 connected to the bus lines 103 and adapted to implement the power amplification for multiplex output signals on the bus lines 103 from the intermediate amplifiers 601. The sense circuit is designed to amplify in multiple stages the complementary signals from the memory cell arrays.

In some cases, equalizing circuits (not shown) are used at the output of the memory cell arrays 100 and at the input of the amplifiers 601 and 602 with the intention of speeding up the sense circuit.

SUMMARY OF THE INVENTION

The above-mentioned Bi-CMOS circuit which reads out signals from memory cells through emitter-follower transistors is capable of fast driving common data line pairs having a relatively large parasitic capacitance, and consequently it enables a significant speed-up of readout operation as compared with those using CMOS circuits for the signal readout section. However, the above-mentioned prior art static RAMs are intended solely for the speed-up of readout operation, and other crucial properties required of static RAMs such as the higher-density integration (higher storage capacity), simplification of manufacturing process and lower supply voltage are not considered.

Accordingly, an object of the present invention is to provide a static RAM which accomplishes the higher-density integration and the higher-speed and lower-voltage operation, while allowing the fabrication in a relatively simple manufacturing process. Other objects and aspects of the invention will become apparent from the following description of embodiments with reference to the accompanying drawings.

In order to achieve the above objective, the inventive static RAM comprises pre-amplifiers made up solely of emitter-follower transistors, with their collectors being supplied with the power voltage, in one-to-one correspondence to subordinate (sub) common data line pairs to which complementary data line pairs of memory cell arrays are connected by column switches. Each pre-amplifier includes a first switch which becomes conductive during the selected state to connect the sub common data line pair to the bases of the transistors, a second switch which becomes conductive during the unselected state to provide a prescribed low bias voltage for the readout signal on the sub common data line pair, with the emitter-follower transistors having their emitters connected to form common emitter lines and connected to a pair of input terminals of a CMOS main amplifier.

The complementary data lines and sub common data lines have a readout signal voltage level that is based on the supply voltage, and the signals are amplified by the main amplifiers each formed of a 1-stage emitter-follower transistor and CMOS transistors, enabling the circuit to operate at a lower supply voltage. The provision of the emitter-follower on the readout path enables high-speed reading, and the use of only bipolar transistors with their collectors connected to the supply voltage simplifies the manufacturing process and device separation and improves the integration density.

Generally, transmission of a signal on a bus line takes place in terms of the charging and discharging of the load capacitance of the bus line and the voltage variation caused by the voltage drop across the resistive section, and therefore the delay of signal transmission in the bus line section increases in proportion to the amplitude of the signal.

On this account, the prior art sense circuit shown in FIG. 11, which is intended to amplify the signal amplitude by means of the intermediate amplifier 601, involves a problem of an increased delay of signal transmission in the following bus line section. The prior art sense circuit is deficient in that the differential amplifier that forms the intermediate amplifier consumes much power and the signal has a self-delay, and therefore it is not suitable for the reduction of power consumption, speed-up of operation and increase of integration density.

Moreover, the prior art sense circuit, in case it includes an equalizing circuit for the sake of speed-up, causes the intermediate amplifier to amplify a residual amplitude on the bus line, and it cannot exert the equalizing effect on the following bus line and circuit sections. Therefore, it needs to have a reinforced equalizing ability and have equalizing circuits provided for individual bus lines.

Accordingly, another object of this invention is to solve the foregoing prior art problems and provide a sense circuit which is operative at a higher speed and lower power consumption based on the smaller-amplitude data signal transmission and enables the higher-density integration.

The above objective is achieved by connecting a current amplifying circuit to each line of bus line pairs for leading out complementary signals from multiple memory cell arrays and connecting a voltage amplifying circuit to a pair of bus lines on which the outputs of the current amplifying circuits are transmitted by being multiplexed. The current amplifying circuit has functions of switching the conduction of data onto data lines for multiplexing and amplifying the data signal, and it will be called "multiplexing current amplifying circuit" in the following discussion.

The multiplexing current amplifying circuit, which solely amplifies the current without amplifying the voltage amplitude, switches the conduction of data onto the data lines at a prescribed timing so that the data is multiplexed with data from other current amplifying circuits. The voltage amplifying circuit amplifies the multiplexed data signal from the multiplexing current amplifying circuits to provide a prescribed voltage level. Consequently, the sense circuit can transmit data in a state of a small signal amplitude and at a high speed and low power consumption, and it becomes possible to accomplish the higher-density integration of semiconductor memory device.

DESCRIPTION OF THE PREFERRED EMBODIMENTS

Figure 1:
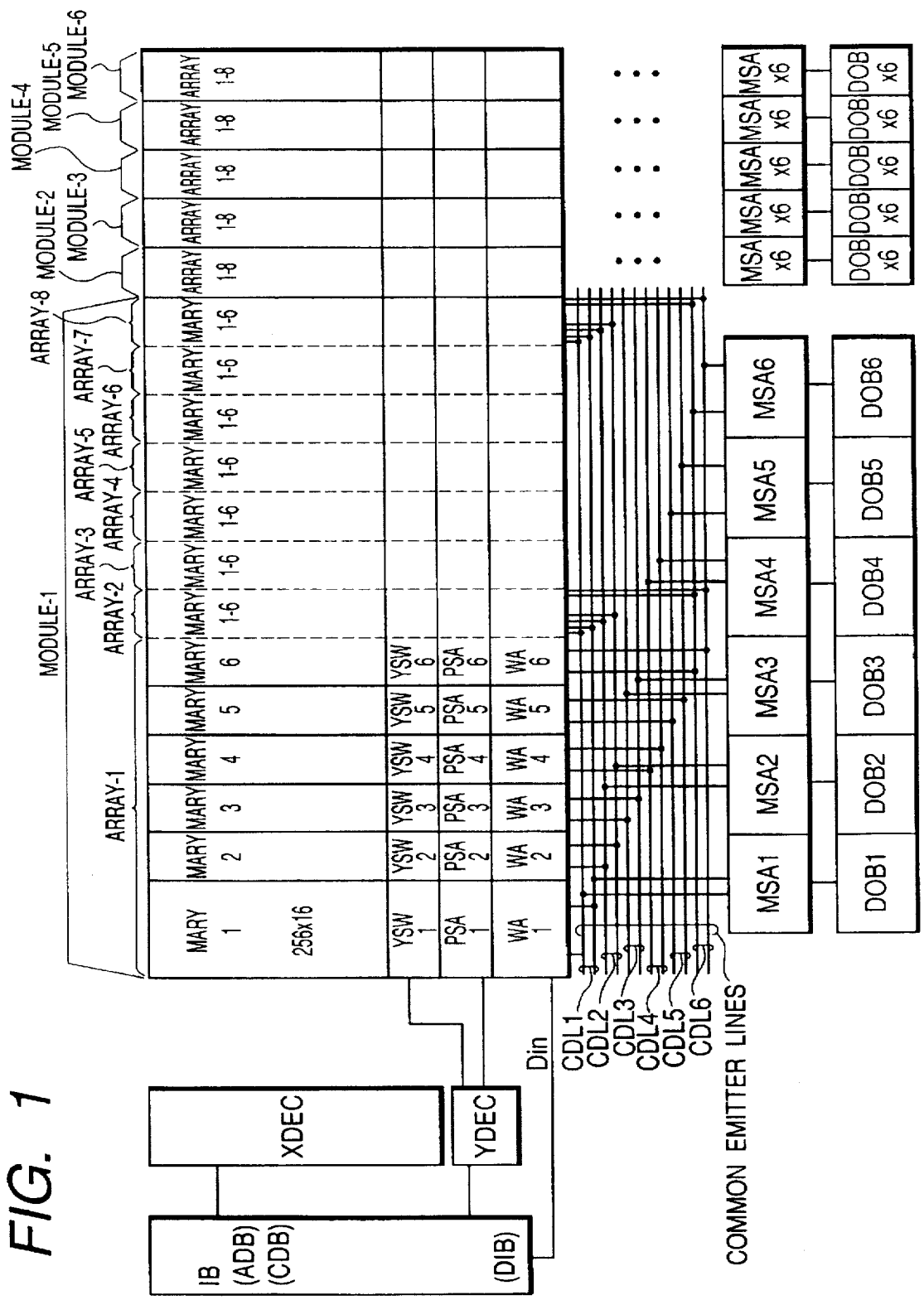
FIG. 1 is a block diagram showing in brief the overall arrangement of the static RAM based on an embodiment of this invention.

FIG. 1 shows in brief the overall arrangement of the static RAM based on an embodiment of this invention. All circuit blocks in the figure are formed on a semiconductor substrate made of monocrystalline silicon or the like.

In this embodiment, one memory array MARY includes 256 word lines and 16 pairs of complementary data lines, thereby having a storage capacity of 4096 (256-by-16) bits or nominally 4K bits, excluding additional redundancy word lines for the relief of defective bits. Six memory arrays MARY1–MARY6 are combined to complete an array having a storage capacity of 24K (4K-by-6) bits.

The memory arrays MARY1–MARY6 are provided with column switches YSW1–YSW6, respectively, for selecting one of 16 complementary data line pairs, and have their selection outputs connected to respective sub common data line pairs. Pre-sense amplifiers PSA1–PSA6 and write amplifiers WA1–WA6 are provided in correspondence to the sub common data line pairs.

Eight arrays, i.e., array-1 through array-8, are combined to form a module (memory block) having a storage capacity of 192K (24K-by-8) bits. The pre-sense amplifiers PSA in these modules have their outputs connected commonly to common emitter lines that are six pairs of signal lines in correspondence to six memory arrays MARY of each array. Six main amplifiers (sense amplifiers) MSA1–MSA6 and six data output circuits DOB1–DOB6 are provided in correspondence to the common emitter lines (common data lines) CDL1–DL6 so that each module reads out data in units of 6 bits.

The static RAM consisting of six modules, i.e., module-1 through module-6, has a total storage capacity of 1152K bits, and reads out data in units of 36 (6-by-6) bits. Among 36 bits of data, 4 bits are assigned to parity bits for error correction, and accordingly the static RAM actually stores 32-bit data. For the 32-bit word structure, it has a storage capacity of 32K (4K-by-8) words.

An input buffer IB includes an address buffer ADB, control buffer CDB and data input buffer DIB. The address signal is fed to an X decoder XDEC which selects address lines and a Y decoder YDEC which forms the column switch select signal and array select signal, and the control signal is fed to a control circuit (not shown). The write-in signal Din introduced through the data input buffer DIB is fed to the write amplifier WA.

The X decoder logically selects a word line which runs through the six memory modules. A word line is not confined to a physical word line. In case the word lines have a heavy duty which retards the cell selecting operation, the word lines may be divided into multiple sets of word lines, with word line drivers having the same logical operation being provided for corresponding lines. This word line division is an obvious consequence when the modules are arranged dividedly in groups on the semiconductor chip.

In each module, one of eight arrays is selected. Following the selection of an array, one complementary data line pair among these of six memory arrays in an array is selected by the column switch YSW. In read mode, the pre-sense amplifiers PSA1–PSA6 for the array are activated to amplify the signals read out onto the sub common data line pairs. For unselected arrays in the module, a certain bias voltage is applied to the inputs of pre-sense amplifiers PSA irrespective of the read/write mode. During write mode, the bias voltage is kept applied also to the pre-sense amplifiers PSA1–PSA6 of the selected array. The write amplifiers WA1–WA6 are activated to amplify the write-in signal Din, and a resulting high-active and low-actual signals are placed on a complementary data line pair selected by the column switches YSW1–YSW6.

Figure 2:
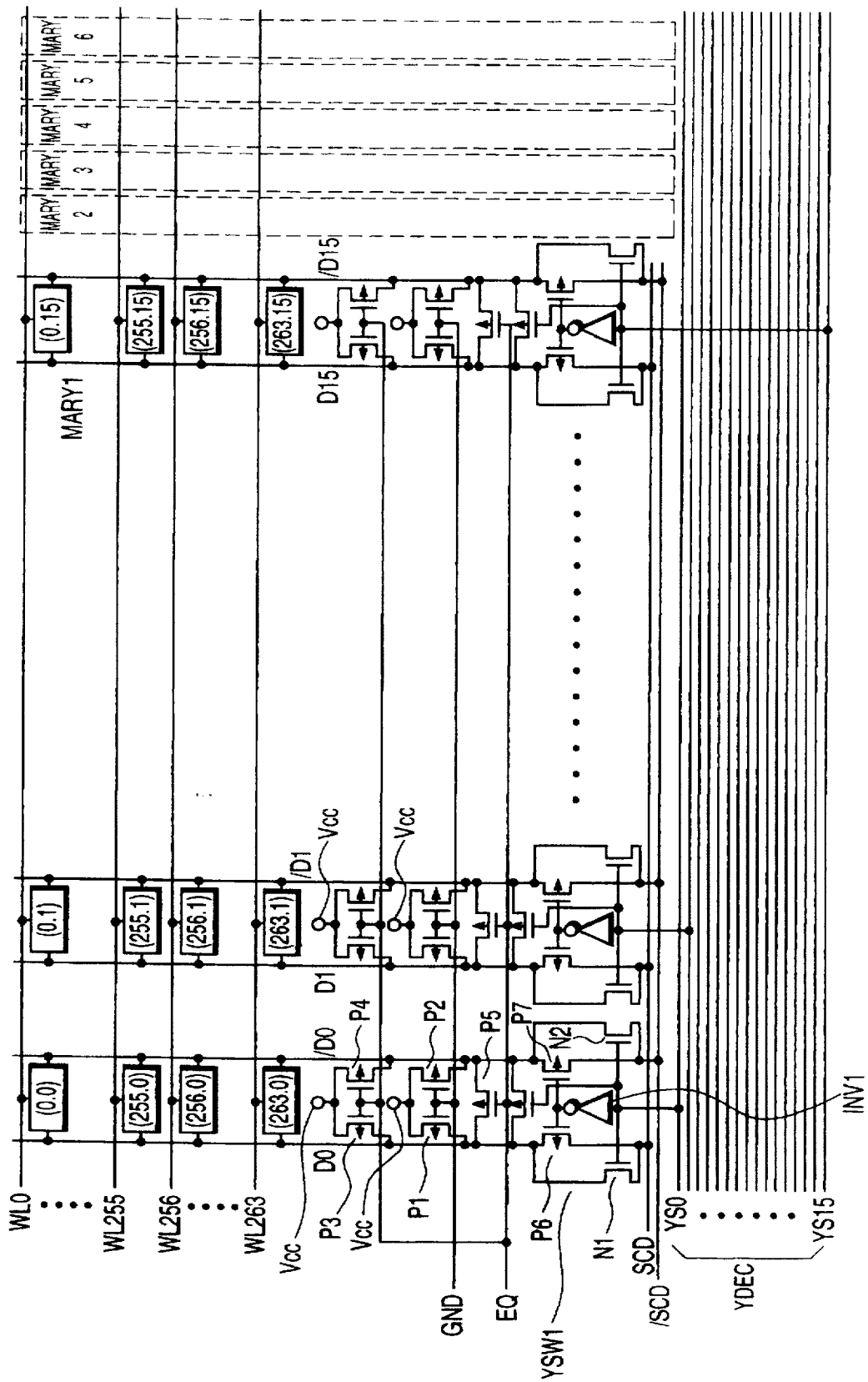
FIG. 2 is a schematic diagram of the memory cell array MARY1 in FIG. 1.

FIG. 2 shows the circuit arrangement of an embodiment of the memory cell array MAY1. Shown in the figure are three complementary data line pairs D0 and /D0, D1 and /D1, and D15 and /D15 and four word lines WL0, WL255, WL256 and WL263 for example. Word lines WL256–WL263 are redundancy word lines in this embodiment. In FIG. 2 and in the following drawings, P-channel MOSFETs are indicated by the arrow mark put on their back gate (channel section) so as to be distinguished from N-channel MOSFETs, and the low-active data line of a complementary data line pair is indicated by the slash mark "/" put on the head of the signal name.

A memory cell (static memory cell) is shown as a small box at the intersection of a word line and a complementary data line pair. Numerals in the box indicate the X (row) address and Y (column) address given to the memory cell. Each memory cell consists of a CMOS latch circuit which includes a pair of CMOS inverters formed of a P-channel MOSFET and N-channel MOSFET with their inputs and outputs connected crisscross to each other, and an N-channel MOSFET for address selection located between the input/output node and the data line of the latch circuit, although this circuit configuration is not shown in the figure. The P-channel MOSFETs of the CMOS inverters can be replaced with poly-silicon resistors having a large resistance value. Each memory cell is of a static type.

Connected between the complementary data lines D0 and /D0 are P-channel MOSFETs P1 and P2, which serve as pull-up resistors by having their sources connected to the supply voltage VCC and their bases grounded steadily for pulling she data lines D0 and /D0 to the supply voltage. These P-channel MOSFETs are designed to have a large on-state resistance so as to reduce their load current during the selected state of the memory cell and reduce the load to the write amplifier at data writing thereby to speed up the voltage falling transition of the write-in signals on the data lines D0 and /D0.

Further connected between the complementary data lines D0 and /D0 are P-channel MOSFETs P3 and P4 which serve as loads to the data lines D0 and /D0 at data reading by being brought to the on-state steadily except for the period of write operation. Another P-channel MOSFET P5 connected between the data lines D0 and /D0 serves as a shorting MOSFET at write recovery and serves as a level limiter for the readout signal during the readout operation. Specifically, when a memory cell connected between the data lines D0 and /D0 is selected by the word line, the low readout level is determined by the conductance ratio of the load resistance of the on-state N-channel MOSFET of the latch circuit and the transmission gate MOSFET of the N-channel MOSFET to the load resistance of the P-channel MOSFETs P3 and P4. With the load MOSFETs P3 and P4 having their conductance set relatively higher, the low readout level is made relatively higher close to the supply voltage VCC. When the readout voltage is about to fall below the threshold voltage of the shorting MOSFET P5, MOSFET P5 turns on to limit the falling level.

The column switch YSW1 is a CMOS switch circuit made up of P-channel MOSFETs P6 and P7 and N-channel MOSFETs N1 and N2 connected in parallel between the data lines D0 and /D0 and sub common data lines SCD and /SCD. A Y selection line YS0 which is supplied with a select signal from the Y decoder DEC is connected to the gates of the N-channel MOSFETs N1 and N2 on the data lines D0 and /D0 and to the input of an inverter INV1. The inverter INV1 has its output terminal connected to the gates of the P-channel MOSFETs P6 and P7 on the data lines D0 and /D0. Based on this circuit arrangement, the N-channel MOSFETs N1 and N2 and P-channel MOSFETs P6 and P7 are brought to the on-state simultaneously in response to the transition to the high level of the Y selection line YS0.

The memory array MAY1 has 16 Y selection lines YS0–YS15 in correspondence to 16 complementary data line pairs D0 and /D0 through D15 and /D15. The lines YS0–YS15 are arranged to run through six memory modules. A Y selection line can be one or more logically-consistent line instead of a single physical line. In case the Y selection lines have a heavy duty or a long wiring which retards the selecting operation of column switch YSW, each line may be divided with the provision of drivers. The division of Y selection line is an obvious consequence when the modules are arranged dividedly in groups on the semiconductor chip.

Figure 3:
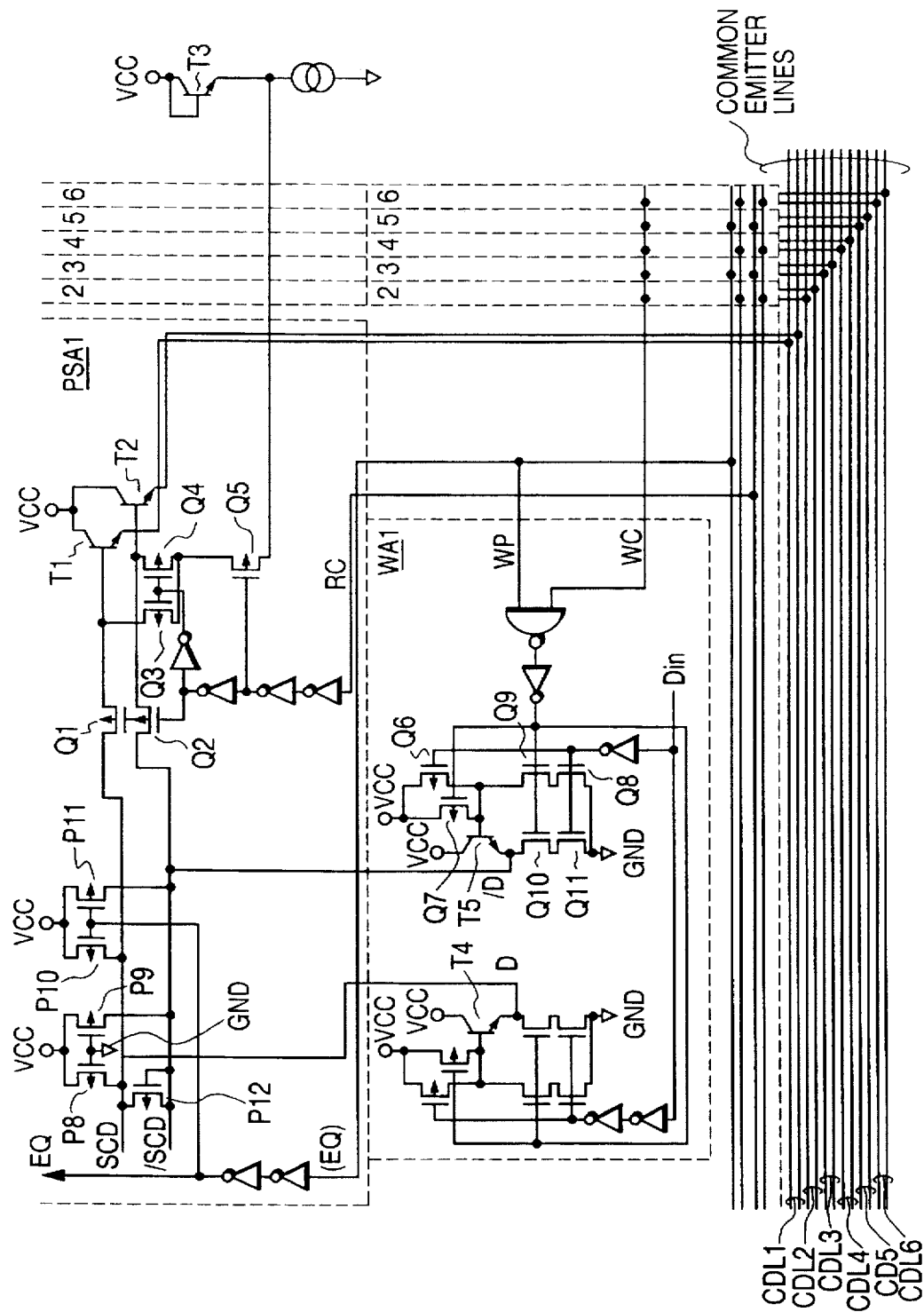
FIG. 3 is a schematic diagram of the pre-sense amplifier and write amplifier of FIG. 1.

FIG. 3 shows the circuit arrangement of an embodiment of the pre-sense amplifier and write amplifier, i.e., PSA1 and WA1 for example out of PSA1–PSA6 and WA1–WA6 provided in correspondence to the modules.

Connected between the sub common data line pair SCD and /SCD are P-channel MOSFETs P8 and P9 which serve as pull-up resistors by having their sources connected to the supply voltage VCC and their bases grounded steadily, as in the case of the complementary data lines, for pulling the sub common data lines SCD and /SCD to the supply voltage. These P-channel MOSFETs P8 and P9 are designed to have a large on-state resistance so as to reduce their load current and reduce the load to the write amplifiers at data writing thereby to speed up the voltage falling transition of the write-in signal on the sub common data lines SCD and /SCD.

Further connected between the complementary sub common data lines SCD and /SCD are P-channel MOSFETs P10 and P11 which are brought to the on-state steadily except for the period of write operation and another P-channel MOSFET P12 which shorts the sub common data lines SCD and /SCD, as in the case of the complementary data line pairs. These P-channel MOSFETs P10, P11 and P12 receive on their gates the equalizing signal EQ, which is also delivered to the similar P-channel MOSFETs on the complementary data line pairs of FIG. 2.

The sub common data lines SCD and /SCD are connected to the bases of bipolar transistors (will be termed simply transistors hereinafter) T1 and T2, which constitute the pre-sense amplifier PSA1 through the channels of the P-channel MOSFETs Q1 and Q2, respectively which serve as the first switch. The transistors T1 and T2 are of the npn type and have their collectors connected to the supply voltage VCC. With the intention of providing the pre-sense amplifier PSA1 with a selecting function, i.e., in order for the selected pre-sense amplifier PSA1 to have its output signal validated on the input of the following main amplifier MSA, there are provided P-channel MOSFETs Q3 and Q4 as the second switch which are biased through another P-channel MOSFET Q5 connected commonly in series to Q3 and Q4.

The transistors T1 and T2 of the pre(-sense) amplifier PSA1 have their emitters connected to common emitter lines (common data lines), which are also connected to the emitters of transistors of the pre-sense amplifiers of the corresponding memory arrays MARY in eight arrays within the module, as will be appreciated from FIG. 1. It is necessary to activate only a selected emitter-follower transistor to deliver the amplified output signal to the following main (sense) amplifier MSA among those of eight pre-sense amplifiers connected to the same common emitter line.

For this implementation, the above-mentioned bias voltage for the second switch is set lower than the readout signal from the memory cell supplied to the base of the selected emitter-follower transistor. Namely, unselected emitter-follower transistors are given such a base bias voltage as to retain in a cutoff state against the signal on the common emitter lines. In this embodiment, a bias voltage VCC-VBE, i.e., the supply voltage VCC lowered by the base-emitter voltage, is produced by a transistor T3 having its base and collector connected together. The transistor T3 is provided on its emitter with a constant current source. This bias voltage generation circuit can be used commonly for the remaining pre-sense amplifiers PSA2~PSA6.

The switching MOSFETs Q1 and Q2 and switching MOSFETs Q3, Q4 and and Q5 are controlled to operate in a complementary manner. Specifically, during the selected state, the Q1 and Q2 are made conductive to deliver the readout signals on the sub common data lines SCD and /SCD to the bases of the transistors T1 and T2 of the pre-sense amplifier PSA1, and during the unselected state, the Q3, Q4 and Q5 are made conductive to deliver the bias voltage VCC-VBE to the bases of T! and T2.

A read select signal RC is produced from the array select signal formed by the Y decoder and the read signal formed by the control circuit. The resulting read select signal RC is fed to the gates of the switching MOSFETs Q1 and Q2 by way of three CMOS inverters in serial connection, and the signal is inverted by a CMOS inverter and fed to the gates of the switching MOSFETs Q3 and Q4. The output signal of the second of the three serial CMOS inverters is delivered as a control signal to the gate of the switching MOSFET Q5.

Based on this circuit arrangement, a high-level (select) read select signal RC causes the switching MOSFETs Q1 and Q2 to be conductive and the switching MOSFETs Q3–Q5 to be non-conductive, and the readout signals on the sub common data lines SCD and /SCD are delivered to the bases of the transistors T1 and T2. Otherwise, a low-level (non-select) read select signal RC causes the switching MOSFETs Q1 and Q2 to be non-conductive and the switching MOSFETs Q3–Q5 to be conductive, and the bias voltage is delivered to the bases of the transistors T1 and T2.

The write amplifier WA1 is formed of bipolar transistors and a CMOS circuit in this embodiment. The amplifier for placing a write-in signal on the sub common data line /SCD includes a CMOS NAND gate circuit made up of P-channel MOSFETs Q6 and Q7 and N-channel MOSFETs Q8 and Q9 in its input section. The MOSFETs Q6 and Q8 at one input of the NAND gate circuit receive the inverted write-in signal Din for the inverted sub common data line /SCD. A write pulse WP which determines the write timing and a write select signal WC produced from the array select signal provided by the Y decoder and the write signal provided by the control circuit are fed to a NAND gate, which delivers the output signal to the gates of the MOSFETs Q7 and Q9 at another input of the NAND gate circuit.

Accordingly, the NAND gate circuit produces a low-level write-in pulse for a high-level write-in signal in write mode at a timing indicated by the write pulse WP. The output stage of the circuit section includes a transistor T5 which receives the output signal of the NAND gate circuit and N-channel MOSFETs Q10 and Q11 connected in series between the emitter of T5 and the ground, with the gates of Q10 and Q11 being supplied with the two input signals. The transistor T5 has its emitter output /D delivered as the write-in signal to the sub common data line /SCD.

The remaining circuit section of the write amplifier WA1 for the sub common data line SCD has the same arrangement except that it receives a non-inverted write-in signal Din through two inverters.

The NAND gate circuit produces a high-level output signal except for the operation of producing a low-level write-in signal described above, and if the sub common data line /SCD has been rendered the low-level writing, it fast rises to the high level VCC-VBE by the conduction of the transistor T5. The write pulse WP which determines the output timing of the low-level write-in signal is delivered as the equalizing signal EQ to the gates of the P-channel MOSFETs by way of series CMOS inverters. Accordingly, after the low-level write-in signal has been delivered, the P-channel MOSFETs become conductive, causing the sub common data line /SCD to regain the supply voltage VCC, i.e., the write recovery operation takes place.

During the period except for the above-mentioned write-in operation, the write amplifier WA1 has its sub common data line /SCD (SCD) in connection with the emitter of T5 (T4) brought to the supply voltage VCC as mentioned above and it is practically brought to the high-impedance state. During the readout operation, the sub common data lines SCD and /SCD have their signal amplitude limited by the P-channel MOSFETs so that it does not fall below VCC-VBE, and therefore the write amplifier WA1 is also brought to the high-impedance state.

Figure 4:
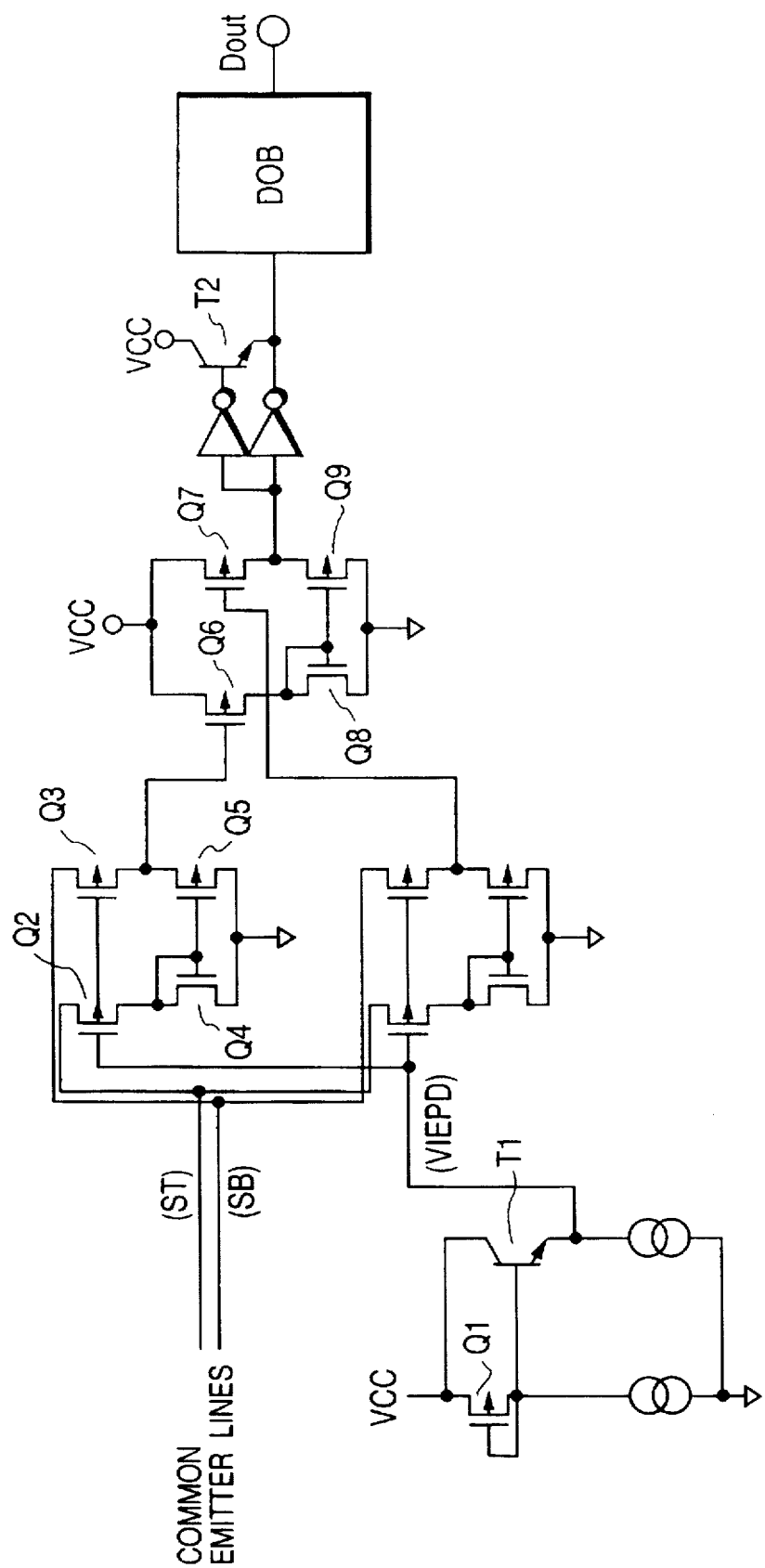
FIG. 4 is a schematic diagram of the main amplifier of FIG. 1.

FIG. 4 shows the circuit arrangement of an embodiment of the main (sense) amplifier MSA. It should be noted that symbols of circuit elements (e.g., Q1, T1) used in FIG. 3 are used again in FIG. 4 to indicate elements of different functions for the sake of simplicity. The main amplifier has its input stage formed of a CMOS circuit so that it can operate at a lower supply voltage. The input terminals are connected to the common emitter line pair (common data line pair) ST and SB that are a non-inverted and inverted signal lines, respectively. The complementary readout signals on the common emitter lines ST and SB are fed to the sources of P-channel MOSFETs Q2 and Q3, which are supplied on their gates with a bias voltage VIEPD for the voltage-to-current converting operation.

In this embodiment, a P-channel MOSFET Q1, having its gate and drain connected together and having the application of the supply voltage on its source, functions as a resistive element, and a constant current is fed through it to produce a constant voltage that is based on the supply voltage VCC. This constant voltage is used to produce the bias voltage VIEPD with an emitter-follower transistor T1 having its collector connected to the supply voltage VCC. Accordingly, the bias voltage VIEPD has a voltage level that is the supply voltage VCC shifted by the constant source-drain voltage of Q1 and the base-emitter voltage of T1. By use of the constant voltage that is based on the supply voltage VCC, it becomes possible for the P-channel MOSFETs Q2 and Q3 to implement the current-to-voltage conversion for the readout signal without being affected by the fluctuation of the supply voltage VCC. Specifically, a rise in the supply voltage VCC does not cause the main amplifier to have an increased power consumption.

As described above, a memory cell is made up of a latch circuit and transmission gate MOSFETs, and the latch circuit produces an output signal having a high level such as the supply voltage and a low level such as the ground voltage. Consequently, signals on the complementary data line pair and sub common data line pair have a high level such as the supply voltage and a low level that is determined from the conductance ratio of the on-state N-channel MOSFETs, transmission gate MOSFETs and load MOSFETs.

With the common emitter lines ST and SB being low and high, respectively, the P-channel MOSFETs Q2 and Q3 of the high-level side have a drain current that corresponds to the voltage applied between the source and gate. Since the MOSFETs Q2 and Q3 are followed on their drain side by N-channel MOSFETs Q4 and Q5 in current-mirror configuration, an amplified current that corresponds to the difference of drain currents of Q2 and Q3 is produced on the node of drains of Q3 and Q5, provided that the MOSFETs Q4 and Q5 are of the same size. In other words, a current signal that corresponds to the amplitude of readout signal, which is a voltage difference of the sub common data lines SCD and /SCD, is produced.

The common emitter lines ST and SB are connected with another amplifier of the same arrangement as explained above, with its inputs having a phase relation opposite to the MOSFETs Q2–Q5. Accordingly, the two amplifiers produce complementary current signals. The current signals are fed to the gates of P-channel MOSFETs Q6 and Q7 that form an amplifying circuit, and converted into a voltage signal. Namely, the complementary current signals are used to charge and discharge the gate capacitance of Q6 and Q7. The MOSFETs Q6 and Q7 are followed on their drain side by N-channel MOSFETs Q8 and Q9 in current-mirror configuration. MOSFETs Q8 and Q9 are of the same size in this embodiment. Accordingly, when the Q6 and Q7 are made conductive and non-conductive, respectively, the drain current of Q6 is fed through the Q8 and Q9 to the output inverter, which then produces a low-level output signal. Otherwise, when the Q6 and Q7 are made non-conductive and conductive, respectively, the drain current of Q7 is fed through the Q8 and Q9 to the output inverter, which then produces a high-level output signal. The high/low readout signal produced on the output of the bipolar CMOS circuit is fed to a data output buffer DOB, which delivers the output data signal to the output terminal Dout.

In the foregoing circuit arrangement, the input stage of the main amplifier also serves for the emitter load of the emitter-follower transistor of the pre-sense amplifier, thereby minimizing the useless power consumption. The lower limit of supply voltage is as low as 2 volts approximately that is the base-emitter voltage VBE of the emitter-follower transistor T1 (T2), i.e., around 0.8 volt, plus the threshold voltage of the P-channel MOSFET Q2 and N-channel MOSFET Q4 (Q3 and Q5), i.e., around 1.2 volt, of the main amplifier. In addition, since the input stage serves as a practical constant-current load to the common emitter line pair, a low-power main amplifier can be accomplished.

Figure 5:
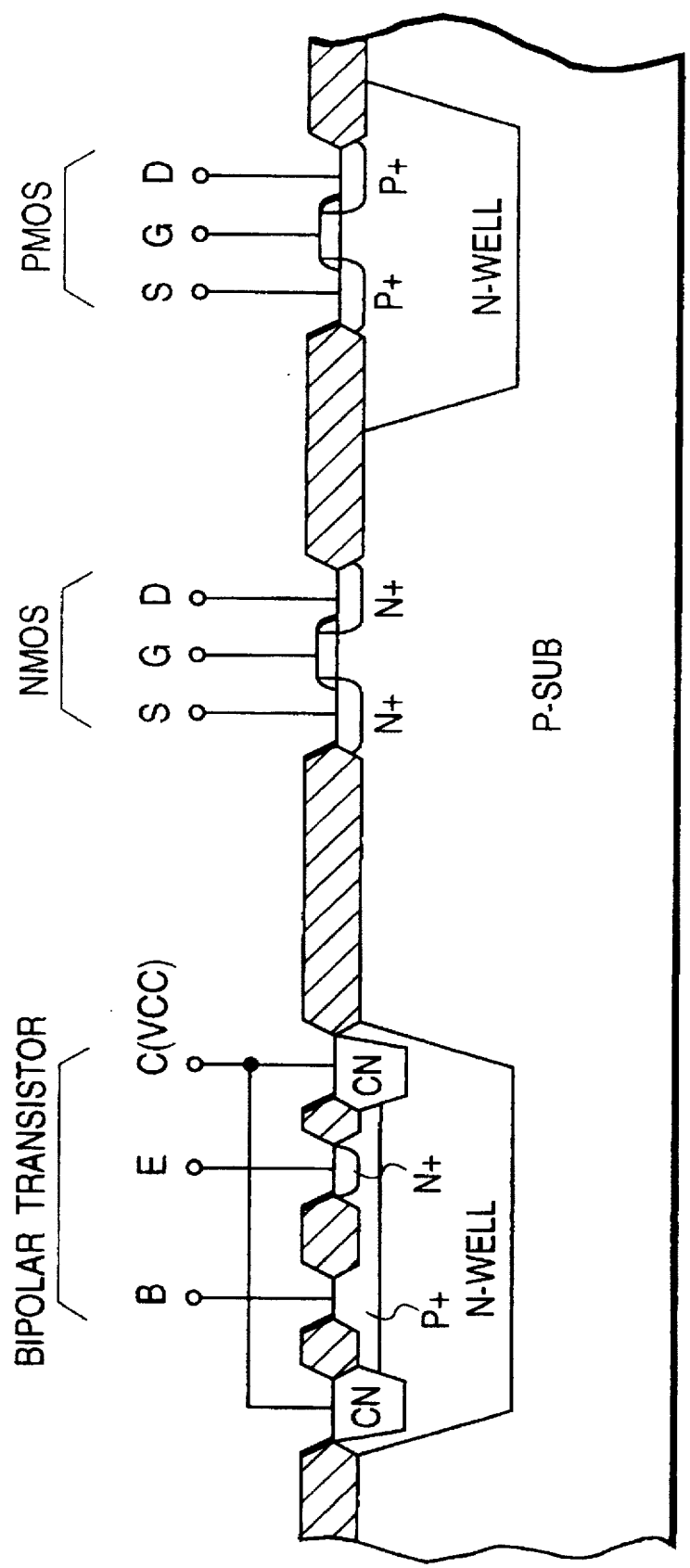
FIG. 5 is a cross-sectional diagram showing in brief the structure of transistors used in the inventive static RAM.

FIG. 5 shows in brief the cross-sectional structure of the circuit elements used in the inventive static RAM. This static RAM consists of N-channel MOSFETs and P-channel MOSFETs which form the CMOS circuit and npn bipolar transistors. The P-channel MOSFETs will be eliminated for CMOS circuits using high-resistance poly-silicon resistors in memory cells.

The P-channel MOSFETs (PMOS) and N-channel MOSFETs (NMOS) are formed based on the known CMOS fabrication technology. The semiconductor substrate is a P-type substrate P-SUB in this embodiment. An N-channel MOSFET (NMOS) is formed as follows. An $N^+$-type source S and drain D are formed on the P-type substrate, and a thin gate insulating film is formed between the source S and drain D on the substrate surface so as to form a gate G to bridge the source S and drain D. A P-channel MOSFET (PMOS) is formed as follows. An N-type well region N-WELL is formed on the P-type substrate surface, a $P^+$-type source S and drain D are formed within the N-WELL, a thin gate insulating film is formed between the source S and drain D on the substrate surface so as to form a gate G to bridge the source S and drain D.

In this embodiment, the above-mentioned CMOS fabricating process is used effectively to form npn bipolar transistors. Specifically, the N-type well region for forming the P-channel MOSFETs is used for the collector region. An $N^+$-type diffusion layer CN for reducing the ohmic contact and collector resistance is formed to surround the collector region. Namely, following the formation of the N-type well region, a processing step is added for forming the $N^+$-type diffusion layer CN selectively in the area where bipolar transistors are formed.

Subsequently, a P-type diffusion layer for the base B is formed by being surrounded by the $N^+$-type diffusion layer NC. Although this P-type diffusion layer is of the same conductivity type as the source and drain of P-channel MOSFET, it is formed to extend much deeper into the semiconductor body by a separate additional processing step. Subsequently, an $N^+$-type diffusion layer for the emitter is formed concurrently to the formation of an $N^+$-type diffusion layer for the source and drain of the N-channel MOSFET. Consequently, the bipolar transistors can be formed by merely adding two processing steps to the CMOS fabricating process, allowing a significant reduction of manufacturing cost.

The bipolar transistors are formed in the N-type well region N-WELL for forming the P-channel MOSFETs, and have device separation by themselves. Consequently, these transistors can be formed at a high integration density on the semiconductor substrate. The feasibility of the formation of bipolar transistors in the N-type well region is based on the fact that all bipolar transistors used in the inventive static RAM have their collectors connected commonly to the supply voltage VCC. The N-type well region N-WELL for the P-channel MOSFETs is biased by the supply voltage VCC, and the bipolar transistors supplied with VCC on the collector can be formed in the same N-type well region N-WELL. Based on the foregoing principle, it becomes possible for the static RAM of this embodiment, even though it includes bipolar transistors, to accomplish a higher-density integration and thus an increased storage capacity.

The effectiveness of this embodiment is as follows.

(1) The inventive static RAM comprises pre-amplifiers made up solely of emitter-follower transistors, with their collectors being connected to the supply voltage, in one-to-one correspondence to sub common data line pairs to which complementary data line pairs of memory cell arrays are connected by column switches. Each pre-amplifier includes a first switch which becomes conductive during the selected state to connect the sub common data line pair to the bases of the transistors, a second switch which becomes conductive during the unselected state to provide a prescribed low bias voltage for the readout signals on the sub common data line pair, with the emitter-follower transistors having their emitters connected commonly to form common emitter lines and connected to a pair of input terminals of a CMOS main amplifier. Consequently, a readout signal level based on the supply voltage is obtained. Based on the signal amplification with the main amplifiers each made up of a single-stage emitter-follower transistor and a CMOS circuit, the static RAM can operate at a lower supply voltage. The provision of emitter-follower transistor on the readout path enables the fast readout operation. The use of bipolar transistors all having their collectors connected to the supply voltage simplifies the manufacturing process, simplifies device separation, and enables high-density integration.

(2) The sub common data line pair is provided with pull-up P-channel MOSFETs having a large resistance for pulling the lines to the supply voltage and P-channel MOSFETs which are made conductive except for the write period so as to limit the amplitude of readout signal from the memory cell, and consequently the supply voltage can be used more efficiently and the write recovery and inverting readout can be sped up.

(3) As an input-stage circuit for the main amplifier provided on the common emitter line pair, a pair of amplifying circuits made up of a pair of P-channel MOSFETs for voltage-to-current conversion having their sources connected to the common emitter line pair, their gates biased by a prescribed voltage, and their drains followed by N-channel MOSFETs in current mirror configuration are used to produce a differential current of the MOSFET pair. The amplifying circuit serves for the load of current source of the emitter-follower transistor that forms the pre-sense amplifier, enabling the low-power and low-voltage operation of the static RAM.

(4) A constant voltage produced by feeding a constant current to a resistor means connected to the power voltage terminal is supplied to the gates of the current-voltage converting P-channel MOSFET through the emitter-follower transistor, and consequently the power consumption of the static RAM is constant without being affected by the fluctuation of supply voltage.

(5) The first switch is connected at its input with the output terminal of the write amplifier that is a CMOS circuit provided for its output stage with a bipolar transistor for high-level output signal formation having its collector connected to the supply voltage, and consequently the write recovery can be sped up.

(6) The bipolar transistor and P-channel MOSFET are formed in N-type well regions on a P-type substrate, with a N-type well region being used for the collector region of the bipolar transistor and an N-type diffusion layer formed in the same processing step as the source/drain diffusion layer of the N-channel MOSFET being used for the emitter region, and consequently the bipolar transistor can be formed by merely adding simple steps to the CMOS fabricating process. In addition, high-density circuit integration is accomplished owing to the separation of bipolar transistor with the N-type well region.

Although the static RAM based on a specific embodiment of this invention has been explained, the invention is not confined to this embodiment, but various changes are obviously possible. For example, the memory structure is not confined to the divisions of modules, arrays and memory arrays of the foregoing embodiment. The names of divisions are not confined to those of the embodiment, but any other name such as memory block may be used. The main amplifier can be configured in various ways on condition that it has a low supply voltage as in the case of the foregoing differential applying circuit formed of CMOS transistors. In a case in which the main amplifier is designed to operate on a negative supply voltage with the intention of providing compatibility with ECL circuits, the VCC and ground terminals of the foregoing circuit arrangement are instead grounded and supplied with the negative voltage, respectively.

Next, the sense circuit based on an embodiment of this invention will be explained with reference to FIG. 6. In the figure, reference numeral 100 denotes memory cell arrays, 101 denotes bus lines A, 102 denotes multiplex current amplifying circuits, 103 denotes bus lines B, and 104 is denotes a voltage amplifying circuit.

The memory cell array 100 corresponds to the memory array MARY1 in each of the array-1 through array-6 of the module-1 shown in FIG. 1. The bus lines (A) 101 correspond to the sub common data line pair SCD and /SCD shown in FIG. 2. The bus lines (B) 103 correspond to the common data line pair (common emitter line pair) CDL1 shown in FIG. 1. The multiplex current amplifying circuit 102 and voltage amplifying circuit 104 correspond to the pre-sense amplifier PSA1 and main sense amplifier MSA1, respectively.

The sense circuit of this embodiment is made up of multiplex current amplifying circuits 102 connected with bus line pairs (A) 101 which conduct complementary output signals from multiple memory cell arrays 100, and a voltage amplifying circuit 104 connected with a bus line pair (B) 103 which conducts the multiplexed output signals of the multiplex current amplifying circuits 102.

The multiplex current amplifying circuit 102 has a function of placing data from the memory cell array 100 on the bus line pair B at a prescribed timing so that it is multiplexed with output signals from other current amplifying circuits and a function of current amplification. Namely, the multiplex current amplifying circuit 102 does not amplify the signal amplitude, and the bus line pair B can be designed to conduct signals with a small amplitude, enabling fast data transmission.

The multiplex current amplifying circuit 102 is designed to produce large current signals within the allowable range of power consumption in response to data signals from the memory cell array 100 so that it can fast charge and discharge the bus line pair B. The data signals on the bus line pair B are rendered the voltage amplification to have a necessary voltage level by the voltage amplifying circuit 104, and the resulting output signals are delivered to other circuits (not shown).

According to the circuit arrangement of this embodiment, in which data signals up to the input of the voltage amplifying circuit 104 have a small common amplitude, it is possible for the multiplex current amplifying circuit 102 to fast charge and discharge the bus line pair B, enabling a fast data transmission and allowing a long-wiring and heavy-load design of the bus line pair B.

It is sufficient for the sense circuit of this embodiment to use, when necessary, at least one equalizing circuit put at the input of the voltage amplifying circuit 104, and circuit components of equalizing circuit and associated control signal lines can be reduced as the whole.

Figure 6:
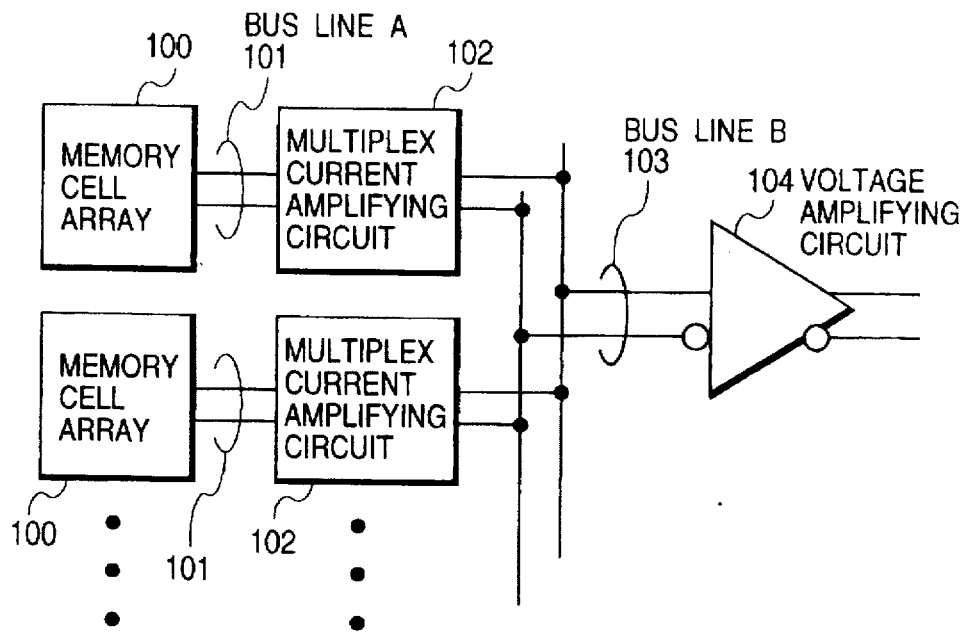
FIG. 6 is a block diagram showing the arrangement of a first embodiment of this invention.
Figure 7:
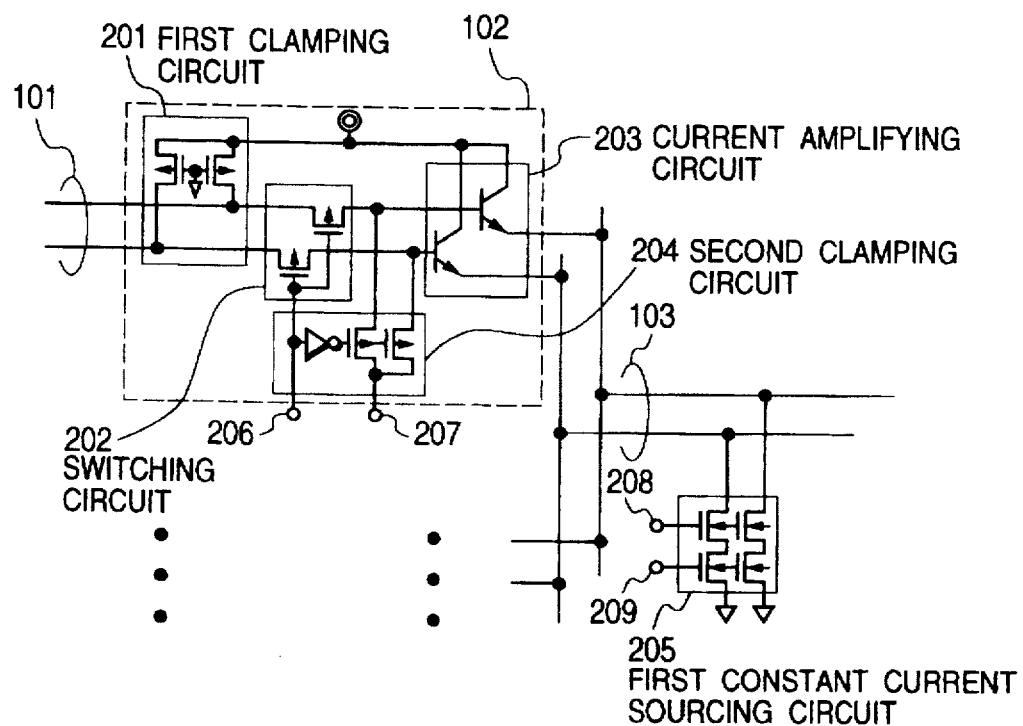
FIG. 7 is a schematic diagram showing the arrangement of a second embodiment of this invention.

FIG. 7 shows the detailed circuit arrangement of the sense circuit shown in FIG. 6. The sense circuit includes a first clamping circuit 201, a switching circuit 202, a current amplifying stage 203, a second clamping circuit 204, and a first constant current sourcing circuit 205. The remaining portions are identical to those of FIG. 6. This embodiment relates to the detailed circuit configuration of the first embodiment in the invention.

In FIG. 7, the multiplex current amplifying circuit 102 consists of a first clamping circuit 201 formed of a pair of PMOS transistors and adapted to fix the input signal voltage level, a switching circuit 202 formed of a pair of PMOS transistors connected to cut in on the signal transmission path and adapted to switch the signal transmission, a current amplifying stage 203 formed of bipolar transistors and connected at the output of the switching circuit 202, and a second clamping circuit 204 connected to the control terminal of the current amplifying stage 203 and adapted to fix the control voltage level (base voltage).

The sense circuit further includes a first constant current sourcing circuit 205, which can be controlled to turn on or off, at the input of the voltage amplifying circuit (not shown in FIG. 7) on the bus line (B) 103 on which output signals of the multiple multiplex current amplifying circuits 102 are transmitted by being multiplexed.

The switching circuit 202 controls the timing of signal transmission to the base of the current amplifying stage 203 in response to the control signal received on the terminal 206, and the data signals from the current amplifying circuits 102 to the bus lines (B) 103 are multiplexed based on the wired-OR logics on the emitters of bipolar transistors. The current amplification is implemented by the current amplifying stage 203 and first constant current sourcing circuit 205.

The first clamping circuit 201 prevents the bus lines (A) 101 from floating when the switching circuit 202 is in the off-state. The second clamping circuit 204 causes the base voltage on the control terminal of the current amplifying stage 203 to have the same voltage level as the bus lines (B) 103 based on the reference clamping voltage received on the terminal 207 when the switching circuit 202 is in the off-state, and it also stabilizes the operation of the current amplifying stage 203 immediately after the switching circuit 202 has turned on.

The first constant current sourcing circuit 205 functions to pull down the current amplification. The circuit 205 is controlled to turn on or off by the control signals received on the control terminals 208 and 209. Specifically, the first constant current sourcing circuit 205 is turned off when the voltage amplifying circuit 104 is not selected at data writing to the memory cell array 100 so as to minimize the power consumption.

According to the second embodiment of this invention, it is possible for the multiplex current amplifying circuit 102 to confine the power consumption mainly to the first constant current sourcing circuit 205, and it can operate at a lower power consumption as the whole. Furthermore, the multiplex current amplifying circuit 102, which consists of a smaller number of elements as compared with the differential voltage amplifying circuit, can be integrated at a higher density.

Figure 8:
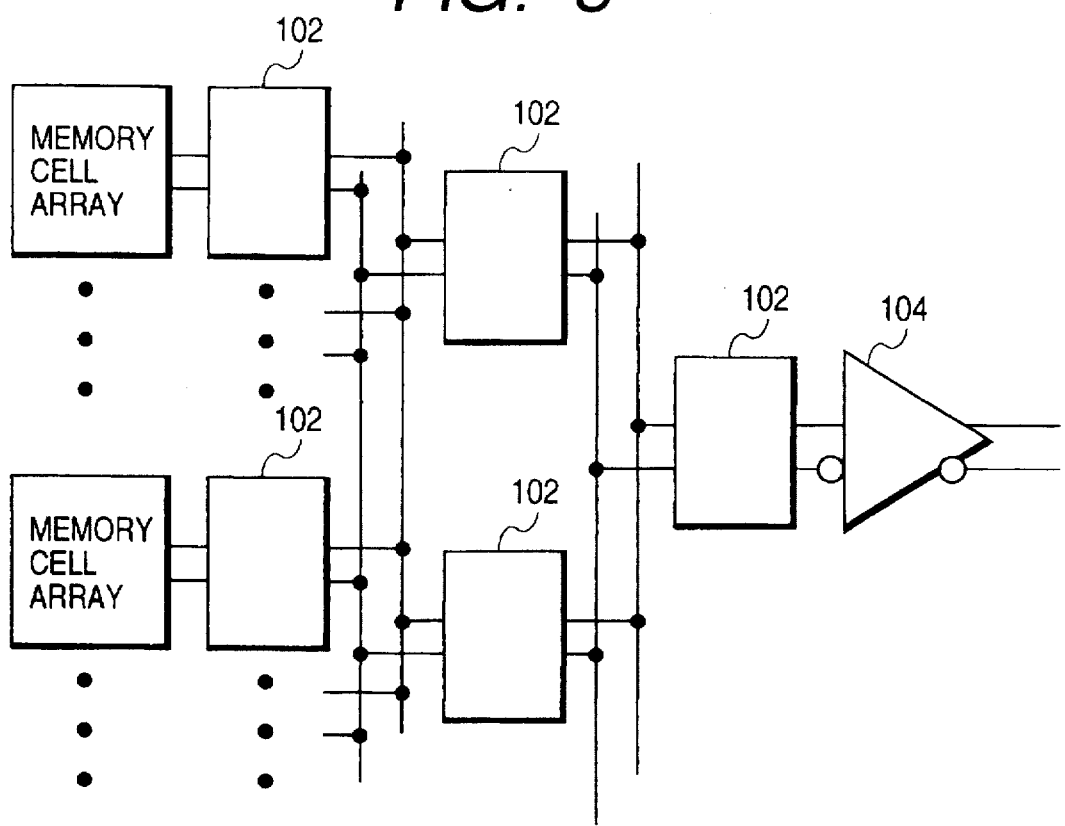
FIG. 8 is a block diagram showing the arrangement of a third embodiment of this invention.

FIG. 8 shows in block diagram the sense circuit based on the third embodiment of this invention, in which the same symbols as those of FIG. 6 are used.

The sense circuit of this embodiment includes multiplex current amplifying circuits 102 in two stages, allowing an increased word length. This arrangement is useful for the case in which long bus lines due to a large storage capacity are divided to reduce the line length.

Figure 9:
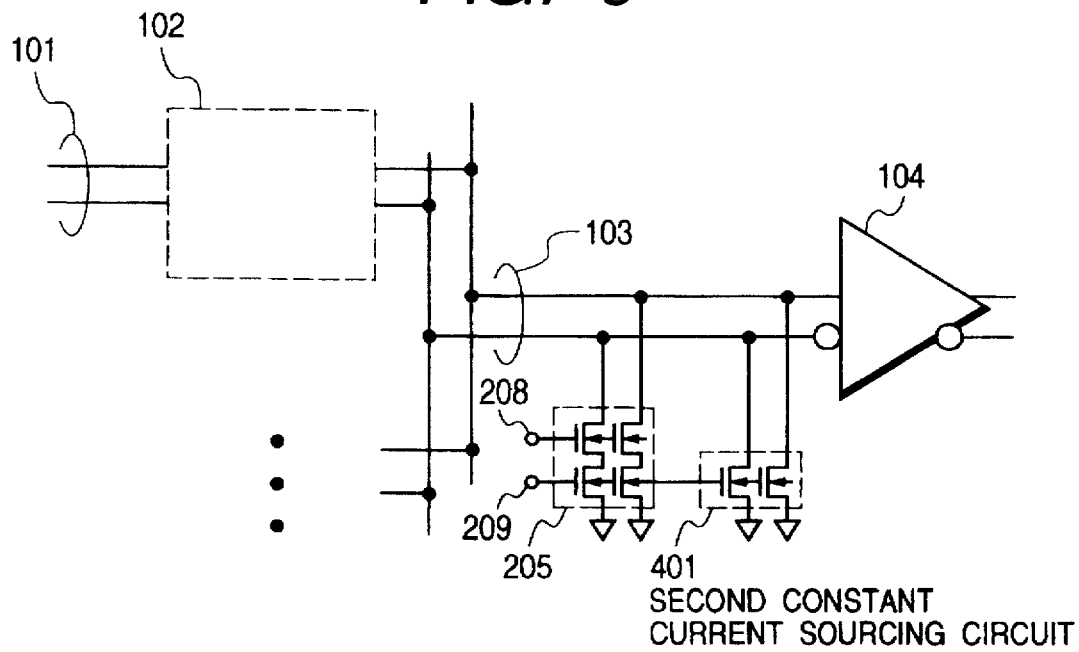
FIG. 9 is a block diagram showing the arrangement of a fourth embodiment of this invention.

FIG. 9 shows in block diagram the sense circuit based on the fourth embodiment of this invention which includes a second constant current sourcing circuit 401 connected in parallel to the first constant current sourcing circuit 205, and the remaining arrangement is identical to FIG. 7. The second constant current sourcing circuit 401 is designed to feed a small current to the bus lines (B) 103 for preventing the bus lines from floating when the first constant current sourcing circuit 205 is off. The second constant current sourcing circuit 401 may be controlled to turn off when the first constant current sourcing circuit 205 is on.

Figure 10:
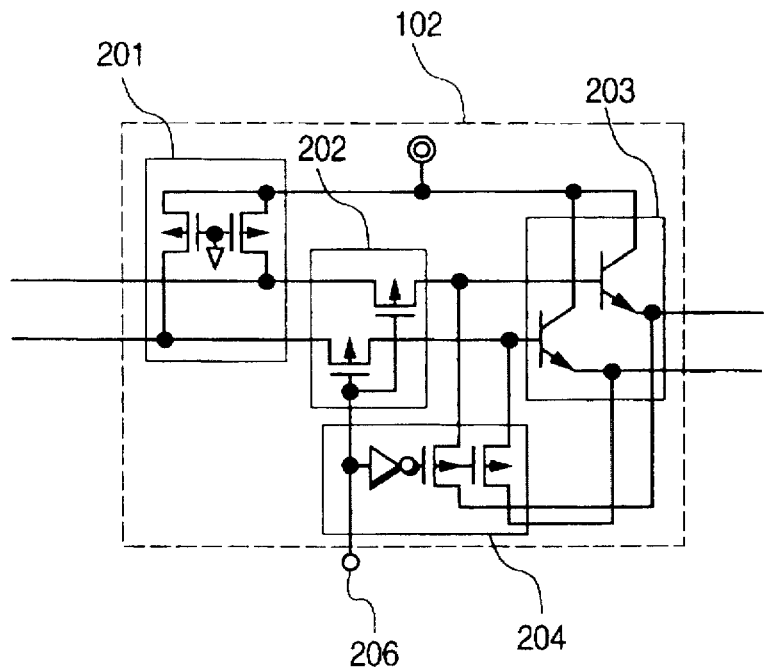
FIG. 10 is a block diagram showing the arrangement of a fifth embodiment of this invention.
Figure 11:
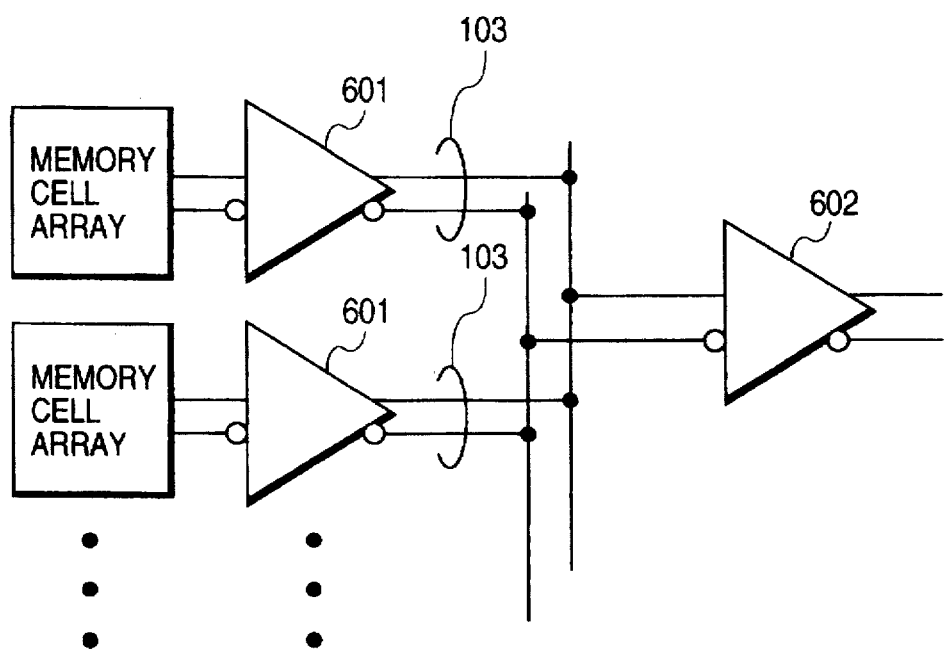
FIG. 11 is a block diagram showing the arrangement of a conventional sense circuit.

FIG. 10 shows in block diagram the sense circuit based on the fifth embodiment of this invention, in which the same symbols as those of FIG. 7 are used.

The sense circuit of this embodiment employs a multiplex current amplifying circuit 102 that is arranged differently from the preceding embodiments. The circuit is designed to control the on/off state of the second clamping circuit 204 in response to the control signal to the switching circuit 202.

The second clamping circuit 204 is formed of a pair of PMOS transistors, with their drains being connected to the emitters of the bipolar transistors of the current amplifying stage 203.

The sense circuit of the fifth embodiment makes the base voltage on the control terminal of the current amplifying stage 203 to be equal to the voltage level of the bus lines (B) 103 when the switching circuit 202 is off, and it also stabilizes the operation of the current amplifying stage 203 immediately after the switching circuit 202 has turned on.

As described above, according to this invention in which a multiplex current amplifying circuit is connected to each of multiple memory cell arrays, with a voltage amplifying circuit being connected commonly to these multiplex current amplifying circuits, it is possible to have a small common signal amplitude up to the input of the voltage amplifying circuit, enabling the multiplex current amplifying circuits to fast charge and discharge the bus lines, whereby high-speed data transmission is made possible. Consequently, it becomes possible to design a semiconductor memory device having a long-wired or heavy-duty bus lines.

The multiplex current amplifying circuit formed of a smaller number of elements enable the operation of the whole circuit at a small power consumption. The inventive circuit arrangement enables high-density integration, and particularly it is useful as means of memory data transmission, switching, sensing, and amplitude conversion.

What is claimed is:

1. A semiconductor memory device comprising: a plurality of memory arrays each including a plurality of static memory cells connected at the intersections of a plurality of word lines and a plurality of complementary data line pairs; column switches each adapted to connect selectively a complementary data line pair of said memory array to a sub common data line pair; P-channel MOSFETs having a large resistance value for pulling up said complementary data line pairs; P-channel MOSFETs adapted to become conductive during the period of operation of the memory device except for the period of write operation to limit the amplitude of readout signals from memory cells; first switches each provided for a sub common data line pair and adapted to become conductive during a selected state to conduct the signals on the sub common data line pair; second switches each provided for a sub common data line pair and adapted to become conductive during an unselected state to conduct a prescribed bias voltage lower than the readout signal on said sub common data line pair; pre-amplifiers each made up solely of a pair of emitter-follower transistors having their bases connected to the common outputs of said first and second switches and their collectors supplied with the power voltage; common emitter lines each connected commonly with the emitters of the emitter-follower transistors of a corresponding pre-amplifier of said memory array; and main amplifiers each consisting of CMOS transistors and having a pair of input terminals connected to said common emitter lines.

2. A semiconductor memory device according to claim 1, wherein said sub common data line pair is provided with P-channel MOSFETs having a large resistance value for pulling up said sub common data line pair to the power voltage and P-channel MOSFETs adapted to become conductive during the period of operation except for the period of write operation to limit the amplitude of readout signals from a memory cell.

3. A semiconductor memory device according to claim 1, wherein each of said main amplifiers has the pair of input terminals thereof connected to a respective common emitter line pair and includes a pair of amplifying circuits each formed of a pair of P-channel MOSFETs for voltage-to-current conversion with their sources connected to said common emitter line pair and their gates supplied with a prescribed bias voltage and further having an N-channel MOSFET in a current-mirror configuration with another P-channel MOSFET provided on the drain side of said P-channel MOSFET pair, said amplifying circuits producing complementary amplified signals.

4. A semiconductor memory device according to claim 3, wherein a constant voltage produced by feeding a constant current to a resistive means which is connected to the power voltage terminal is supplied as said bias voltage to the gates of current-to-voltage converting P-channel MOSFETs.

5. A semiconductor memory device according to claim 1, wherein said first switch has its inputs connected to the output terminals of a write amplifier, said write amplifier including an output stage of a CMOS circuit with bipolar transistors, the collectors of which are supplied with the power voltage, for producing high-level output signals.

6. A semiconductor memory device according to claim 5, wherein the bipolar transistors and P-channel MOSFETs are formed in N-type well regions formed on a P-type substrate, each said bipolar transistor using the N-type well region thereof for its collector region and using an N-type diffusion layer, which is formed in the same process as the source/drain diffusion layer of an N-channel MOSFET, for its emitter region.

7. A sense circuit for amplifying complementary signals comprising current amplifying circuits each connected to one of multiple bus line pairs which are transmission lines of complementary signals, and a voltage amplifying circuit connected to a pair of bus lines for transmitting multiplexed output signals of said current amplifying circuits, wherein each current amplifying circuit includes a first clamping circuit for fixing a voltage level of the input signals, a switching circuit for switching the signal transmission, a current amplifying stage having its control terminals connected to the outputs of said switching circuit, and a second clamping circuit for fixing the voltage level of the control terminals of said current amplifying stage, said sense circuit being controlled on the basis of the control signal of the switching circuit and including a first constant current sourcing circuit which is provided on each of said bus line pairs for transmitting multiplexed output signals of said current amplifying stage and adapted to be controlled to turn on or off.

8. A sense circuit according to 7 further including a second constant current sourcing circuit for stabilizing a voltage of the bus lines, to which said first constant current sourcing circuit is connected, when said first constant current sourcing circuit is off.

9. A semiconductor memory device comprising:
(a) a first memory block including a first memory array and a second memory array;
(b) a second memory block including a third memory array and a fourth memory array;
(c) a first sub common data line pair;
(d) a second sub common data line pair;
(e) a first main common data line pair;
(f) a first bipolar transistor having its collector supplied with a power voltage, its base connected to one line of said first sub common data line pair, and its emitter connected to one line of said first main common data line pair;

(g) a second bipolar transistor having its collector supplied with the power voltage, its base connected to another line of said first sub common data line pair, and its emitter connected to another line of said first main common data line pair;
(h) a third bipolar transistor having its collector supplied with the power voltage, its base connected to one line of said second sub common data line pair, and its emitter connected to said one line of said first main common data line pair;
(i) a fourth bipolar transistor having its collector supplied with the power voltage, its base connected to another line of said second sub common data line pair, and its emitter connected to said another line of said first main common data line pair; and
(j) a first amplifier having a pair of inputs connected to said first main common data line pair,
said first memory array including:
  a first data line pair;
  a plurality of first word lines which intersect said first data line pair;
  a plurality of first memory cells provided in correspondence to the intersections of said first data line pair and said first word lines; and
  a first column switch connected between said first data line pair and said first sub common data line pair,
said second memory array including:
  a second data line pair;
  a plurality of second word lines which intersect said second data line pair;
  a plurality of second memory cells provided in correspondence to the intersections of said second data line pair and said second word lines; and
  a second column switch connected between said second data line pair and said first sub common data line pair,
said third memory array including:
  a third data line pair;
  a plurality of third word lines which intersect said third data line pair;
  a plurality of third memory cells provided in correspondence to the intersections of said third data line pair and said third word lines; and
  a third column switch connected between said third data line pair and said second sub common data line pair, and
said fourth memory array including:
  a fourth data line pair;
  a plurality of fourth word lines which intersect said fourth data line pair;
  a plurality of fourth memory cells provided in correspondence to the intersections of said fourth data line pair and said fourth word lines; and
  a fourth column switch connected between said fourth data line pair and said second sub common data line pair.

10. A semiconductor memory device according to claim 9, wherein said first, second, third and fourth memory cells are of the static type.

11. A semiconductor memory device according to claim 10, wherein said first column switch and said second column switch do not become conductive simultaneously and said third column switch and said fourth column switch do not become conductive simultaneously.

12. A semiconductor memory device according to claim 11 further including:

a first pre-charge circuit which pre-charges said first sub common data line pair to a predetermined voltage; and a second pre-charge circuit which pre-charges said second sub common data line pair to said predetermined voltage.

13. A semiconductor memory device according to claim 12, wherein said first pre-charge circuit pre-charges said first sub common data line pair to the power voltage and said second pre-charge circuit pre-charges said second sub common data line pair to the power voltage.

14. A semiconductor memory device according to claim 13, wherein said first memory array further includes a third pre-charge circuit which is connected to said first data line pair and adapted to pre-charge said first data line pair to the power voltage, said second memory array further includes a fourth pre-charge circuit which is connected to said second data line pair and adapted to pre-charge said second data line pair to the power voltage, said third memory array further includes a fifth pre-charge circuit which is connected to said third data line pair and adapted to pre-charge said third data line pair to the power voltage, and said fourth memory array further includes a sixth pre-charge circuit which is connected to said fourth data line pair and adapted to pre-charge said fourth data line pair to the power voltage.

15. A semiconductor memory device according to claim 9 further including:

a first control circuit which brings said first and second bipolar transistors to a non-conductive state; and a second control circuit which brings said third and fourth bipolar transistors to a non-conductive state.

16. A semiconductor memory device according to claim 15, wherein said first control circuit includes:

a first switch circuit connected between the bases of said first and second bipolar transistors and said first sub common data line pair; and a circuit which is connected to the bases of said first and second bipolar transistors and adapted to supply a predetermined voltage that is lower than the power voltage to the bases of said first and second bipolar transistors, and said second control circuit includes:

a second switch circuit connected between the bases of said third and fourth bipolar transistors and said second sub common data line pair; and a circuit which is connected to the bases of said third and fourth bipolar transistors and adapted to supply said predetermined voltage lower than the power voltage to the bases of said third and fourth bipolar transistors.

17. A semiconductor memory device according to claim 9 further including:

(a) a third sub common data line pair;

(b) a fourth sub common data line pair;

(c) a second main common data line pair;

(d) a fifth bipolar transistor having its collector supplied with the power voltage, its base connected to one line of said third sub common data line pair, and its emitter connected to one line of said second main common data line pair;

(e) a sixth bipolar transistor having its collector supplied with the power voltage, its base connected to another line of said third sub common data line pair, and its emitter connected to another line of said second main common data line pair;

(f) a seventh bipolar transistor having its collector supplied with the power voltage, its base connected to one line of said fourth sub common data line pair, and its emitter connected to said one line of said second main common data line pair;

(g) an eighth bipolar transistor having its collector supplied with the power voltage, its based connected to another line of said fourth sub common data line pair, and its emitter connected to said another line of said second main common data line pair; and (h) a second amplifier having a pair of inputs connected to said second main common data line pair.

said first memory array further including:

a fifth data line pair;

a plurality of fifth memory cells provided in correspondence to the intersections of said fifth data line pair and said first word lines; and a fifth column switch connected between said fifth data line pair and said third sub common data line pair.

said second memory array further including:

a sixth data line pair;

a plurality of sixth memory cells provided in correspondence to the intersections of said sixth data line pair and said second word lines; and a sixth column switch connected between said sixth data line pair and said third sub common data line pair.

said third memory array further including:

a seventh data line pair;

a plurality of seventh memory cells provided in correspondence to the intersections of said seventh data line pair and said third word lines; and a seventh column switch connected between said seventh data line pair and said fourth sub common data line pair, and said fourth memory array further including:

an eighth data line pair;

a plurality of eighth memory cells provided in correspondence to the intersections of said eighth data line pair and said fourth word lines; and an eighth column switch connected between said eighth data line pair and said fourth sub common data line pair.

18. A semiconductor memory device comprising:

(a) a first memory block including a first memory array and a second memory array;

(b) a second memory block including a third memory array and a fourth memory array;

(c) a first common data line pair;

(d) a second common data line pair;

(e) a third common data line pair;

(f) a first bipolar transistor having its collector supplied with a first voltage, its base connected to one line of said first common data line pair, and its emitter connected to one line of said third common data line pair;

(g) a second bipolar transistor having its collector supplied with said first voltage, its base connected to another line of said first common data line pair, and its emitter connected to another line of said third common data line pair;

(h) a third bipolar transistor having its collector supplied with said first voltage, its base connected to one line of said second common data line pair, and its emitter connected to said one line of said third common data line pair;

(i) a fourth bipolar transistor having its collector supplied with said first voltage, its base connected to another line of said second common data line pair, and its emitter connected to said another line of said third common data line pair; and (j) a first amplifier having a pair of inputs connected to said third common data line pair, said first memory array including:
- a first data line pair;
- a plurality of first word lines which intersect said first data line pair;
- a plurality of first memory cells provided in correspondence to the intersections of said first data line pair and said first word lines; and
- a first selection switch connected between said first data line pair and said first common data line pair, said second memory array including:
- a second data line pair;
- a plurality of second word lines which intersect said second data line pair;
- a plurality of second memory cells provided in correspondence to the intersections of said second data line pair and said second word lines; and
- a second selection switch connected between said second data line pair and said first common data line pair, said third memory array including:
- a third data line pair;
- a plurality of third word lines which intersect said third data line pair;
- a plurality of third memory cells provided in correspondence to the intersections of said third data line pair and said third word lines; and
- a third selection switch connected between said third data line pair and said second common data line pair, and said fourth memory array including:
- a fourth data line pair;
- a plurality of fourth word lines which intersect said fourth data line pair;
- a plurality of fourth memory cells provided in correspondence to the intersections of said fourth data line pair and said fourth word lines; and
- a fourth selection switch connected between said fourth data line pair and said second common data line pair.

19. A semiconductor memory device according to claim 18, wherein said first, second, third and fourth memory cells are of the static type.

20. A semiconductor memory device according to claim 19, wherein said first selection switch and said second selection switch do not become conductive simultaneously and said third selection switch and said fourth selection switch do not become conductive simultaneously.

21. A semiconductor memory device according to claim 18 further including:
- a first pre-charge circuit which pre-charges said first common data line pair to a predetermined voltage; and
- a second pre-charge circuit which pre-charges said second common data line pair to said predetermined voltage.

22. A semiconductor memory device according to claim 21, wherein said first pre-charge circuit pre-charges said first common data line pair to said first voltage and said second pre-charge circuit pre-charges said second common data line pair to said first voltage.

23. A semiconductor memory device according to claim 22, wherein said first memory array further includes a third pre-charge circuit which is connected to said first data line pair and adapted to pre-charge said first data line pair to said first voltage, said second memory array further includes a fourth pre-charge circuit which is connected to said second data line pair and adapted to pre-charge said second data line pair to said first voltage, said third memory array further includes a fifth pre-charge circuit which is connected to said third data line pair and adapted to pre-charge said third data line pair to said first voltage, and said fourth memory array further includes a sixth pre-charge circuit which is connected to said fourth data line pair and adapted to pre-charge said fourth data line pair to said first voltage.

24. A semiconductor memory device according to claim 18 further including:
- a first control circuit which brings said first and second bipolar transistors to a non-conductive state; and
- a second control circuit which brings said third and fourth bipolar transistors to a non-conductive state.

25. A semiconductor memory device according to claim 24, wherein said first control circuit includes:
- a first switch circuit connected between the bases of said first and second bipolar transistors and said first common data line pair; and
- a circuit which is connected to the bases of said first and second bipolar transistors and adapted to supply a predetermined voltage that is lower than said first voltage to the bases of said first and second bipolar transistors, and said second control circuit includes:
- a second switch circuit connected between the bases of said third and fourth bipolar transistors and said second common data line pair; and
- a circuit which is connected to the bases of said third and fourth bipolar transistors and adapted to supply said predetermined voltage lower than said first voltage to the bases of said third and fourth bipolar transistors.

* * * * *